United States Patent

[11] 3,619,731

[72] Inventors Lawrence K. Baker
Clinton;
Lawrence R. Shardlow, South Plainfield,
both of N.J.

[21] Appl. No. 766,786
[22] Filed Oct. 11, 1968
[45] Patented Nov. 9, 1971
[73] Assignee RCA Corporation

[54] MULTIPLE PELLET SEMICONDUCTOR DEVICE
5 Claims, 3 Drawing Figs.

[52] U.S. Cl. ........................................................ 317/234 R,
317/234 E, 317/234 F, 317/234 H, 317/234 N,
317/234 W, 317/235 AB
[51] Int. Cl. ........................................................ H01l 1/08,
H01l 1/10, H01l 1/14, H01l 1/22
[50] Field of Search ............................................ 317/234 A,
234 W, 234 E, 234 T, 234 F, 234 K

[56] References Cited

UNITED STATES PATENTS

| | | | |
|---|---|---|---|
| 2,702,360 | 2/1955 | Giacoletto .................... | 317/234 |
| 3,047,780 | 7/1962 | Metz ............................ | 317/234 |
| 3,249,827 | 5/1966 | Benda et al. .................. | 317/234 |
| 3,264,531 | 8/1966 | Dickson ........................ | 317/234 |

*Primary Examiner*—John W. Huckert
*Assistant Examiner*—William D. Larkins
*Attorney*—G. H. Bruestle

ABSTRACT: A semiconductor device comprises a substrate, a first semiconductor pellet mounted on the substrate, an insulating material washer mounted on the first pellet, and a second semiconductor pellet mounted on the washer. The second pellet is rigidly secured to the washer and the first pellet, and electrically connected to the first pellet, by means of a solder filling the washer central opening and bonded to both pellets.

INVENTORS
Lawrence K. Baker &
Lawrence R. Shardlow
BY M. Y. Epstein
ATTORNEY

MULTIPLE PELLET SEMICONDUCTOR DEVICE

BACKGROUND OF THE INVENTION

This invention relates to semiconductor devices, and particularly to semiconductor devices of the type including two or more semiconductor pellets.

The use of multiple semiconductor devices is known. In such devices, the semiconductor pellets are generally mounted on a common substrate, and electrical connections between the pellets are provided by means of connecting wires. Disadvantages of this arrangement relate to the relatively large substrate required, and the resulting large device, and to the expense of providing the electrical connections between the pellets. The need exists, therefore, for improvements in the mounting of the pellets with respect to one another, and for means for reducing the cost of the devices.

SUMMARY

A semiconductor device comprises a pair of semiconductor pellets and an insulating member disposed therebetween. The two pellets are electrically connected to one another, and mechanically joined to the insulating member, by means of a solid, conductive material extending through the insulating member and bonded to the member and the two pellets.

DESCRIPTION OF PREFERRED EMBODIMENTS

Figure 1:
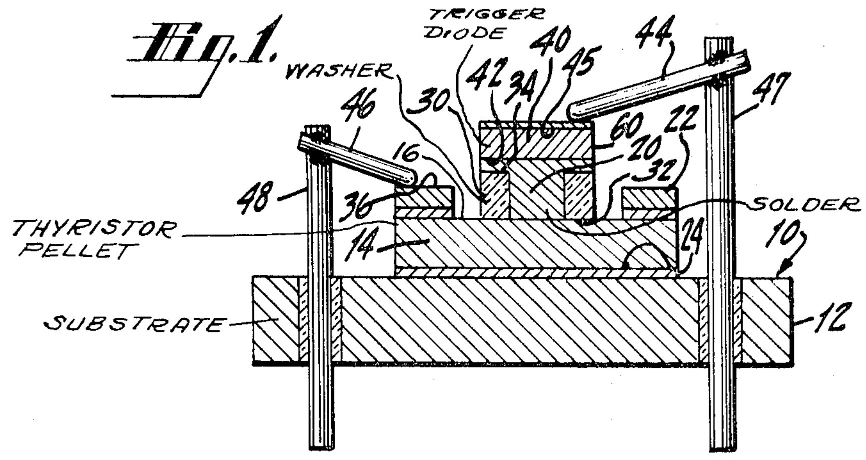
FIG. 1 is a side elevation, in section, of a semiconductor device mount made in accordance with the present invention.

With reference to FIG. 1, a semiconductor device mount 10 is shown comprising a substrate 12 of, e.g., nickel plated steel, having a semiconductor, e.g., silicon, pellet 14 mounted thereon. In this embodiment, the pellet 14 is a thyristor pellet of known type, and has, on the upper surface 16 thereof, a centrally disposed mass of solder 20, e.g., of lead, connected to the gate region of the pellet, and a peripherally disposed ring-shaped metal electrode 22, e.g., of copper, connected to the cathode region of the pellet. The lower surface 24 of the pellet 14, which is connected to the anode region of the pellet, is soldered to the substrate 12.

Mounted on the pellet 14 within the cathode ring 22 is a flat washer 30 of an insulating material, such as alumina ceramic. The lower flat surface 32 of the washer 30 rests on the upper surface 16 of the pellet 14, and the washer 30 has a thickness to dispose the upper flat surface 34 of the washer above the upper surface 36 of the cathode ring 22. The inside wall of the washer 30 is metallized, as with molybdenum, and the washer 30 is soldered in place by means of the solder mass 20.

Mounted on the washer 30 is a second pellet 40. The second pellet 40, in this embodiment, is an open-base transistor, known also as a trigger diode, of known type. The lower surface 42 of the pellet 40, connected to a first region of the pellet, is soldered to the washer 30, and electrically connected to the gate region of the pellet 14, by means of the solder 20.

A lead wire 44 is electrically and mechanically connected, as by soldering, to the upper surface 45 of the pellet 40, the surface 45 being connected to a second region of the pellet. Trigger diodes, as known, are bidirectional in operation, and the first and second regions of the pellet 40 are either emitter or collector regions, depending upon the voltage polarity across the pellet.

A lead wire 46 is connected, as by soldering, to the cathode electrode 22 of the pellet 14. The two leads 44 and 46 are connected, as by welding, to terminals 47 and 48, respectively, insulating sealed through the substrate 12.

An enclosure (not shown) for the mount 10 can comprise a solid mass of a thermosetting plastic molded about the mount.

In another embodiment, not illustrated, the washer 30 is provided with a solid core of metal, e.g., copper, filling the central opening of the washer as a plug. In such embodiment, the pellets 14 and 40 are soldered to the metal plug.

Figures 2, 3:
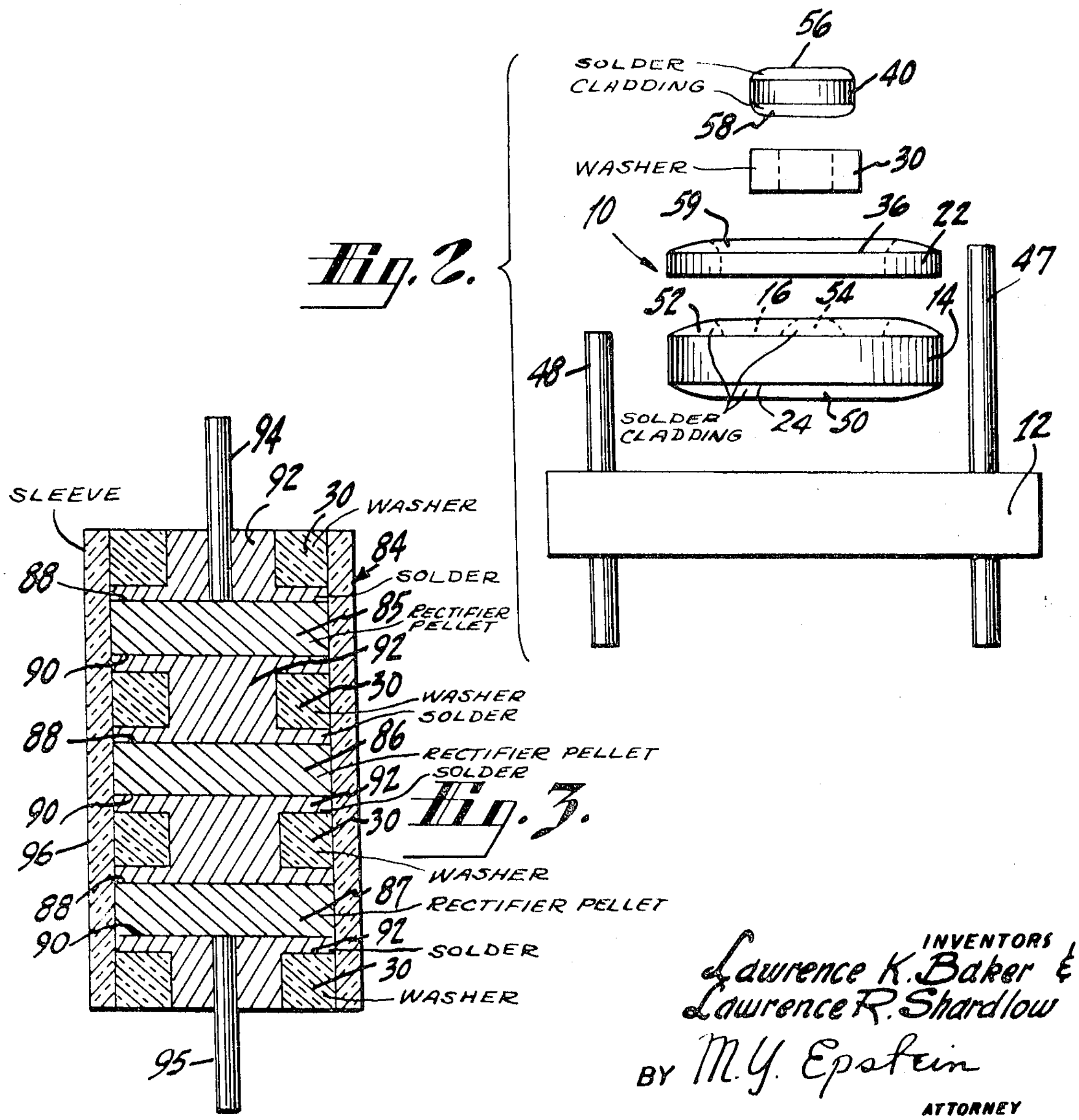
FIG. 2 is an exploded view illustrating the assembly of certain ones of the parts of the mount shown in FIG. 1.
FIG. 3 is a side elevation, in section, showing another embodiment of the invention.

With reference to FIG. 2, the assembly of the mount 10 is described. Using known processes, the pellets 14 and 40 are provided with claddings of solder as follows: a cladding 50 on the lower surface 24 of the pellet 14; a ring 52 of solder covering the cathode region at the upper surface 16 of the pellet 14; a dot 54 of solder covering the gate region at the upper surface 16 of the pellet 14; and claddings 56 and 58 covering the upper and lower surfaces, respectively, of the pellet 40. The cladding process can comprise, for example, providing a thin nickel plating on the pellet surfaces to be clad, and dipping the pellet in a bath of lead solder. The cladding process results in the solder claddings having a generally convex shape. Also, the upper surface 36 of the cathode electrode 22 is provided with a solder coating 59.

The pellet 14 is placed on the substrate 12, and the ring electrode 22 is positioned on the pellet solder cladding 52. The ceramic washer 30 is next dropped in place within the ring 22 and in surrounding relation with the solder dot 54 on the pellet 14. The pellet 40 is next placed on top of the washer 30, the central opening of the washer receiving the convex mass 58 of solder on the pellet 40, and thus tending to automatically center the pellet 40 on the washer 30.

While centering of the pellet 40 on the washer 30 is preferred, it is not critical. This is because, owing to the greater thickness of the washer 30 as compared with the cathode ring 22 (see FIG. 1), there is little likelihood of the pellet 40 touching the cathode electrode 22 and thus shorting together, via the mass of solder 20, the cathode and gate regions of the pellet 14.

The leads 44 and 46 are then connected to the terminals 47 and 48, respectively, as by welding, and the leading ends of the leads 44 and 46 are engaged with the solder clad surfaces of the pellet 40 and the electrode 22, respectively.

Although not shown, suitable jigging means can be used to facilitate stacking of the mount parts.

The assembly is then heated to melt the various solder claddings. The lower surface 24 of the pellet 14 is thus soldered to the substrate 12, the cathode ring 22 is soldered to the cathode region of the pellet 14, and the solder dot 54 on the pellet 14 and the solder cladding 58 on the pellet 40 merge within the central opening of the washer 30 to form the solder mass 20 (FIG. 1). The solder 20 wets the metallized inner wall of the washer 30 and firmly bonds the two pellets 14 and 40 and the washer 30 together to form a rigid three element laminate. The washer central opening provides a well to receive the molten solder from the pellet 40, thus minimizing the possibility of the molten solder 58 flowing up the side 60 of the pellet 40 and shorting together the first and second regions of the pellet 40. Further, the washer 30 prevents the molten solder 20 within the washer 30, or the solder 52 without the washer 30, from flowing along the surface 16 of the pellet 14 and thus shorting together the gate and cathode regions of the pellet 14.

The leads 44 and 46 are also soldered to the pellet 40 and the electrode 22, respectively, during the heating step.

In FIG. 3 is shown a rectifying device 84 comprising a stack of three rectifier pellets 85, 86, and 87 assembled in a vertical column with ceramic washers 30 disposed between each pair of pellets and at the ends of the device. The rectifier pellets 85, 86, and 87 are of known type, each having a top surface 88 connected to the pellet cathode, and a bottom surface 90 connected to the pellet anode. The top surfaces 88 of the pellets 86 and 87 are electrically connected, respectively, by masses of solder 92 through the central openings of washers 30 to the bottom surfaces 90 of the pellets 85 and 86. The pellets 85, 86, and 87 are thus in series, providing the device 84 with a voltage rating in the order of the sum of the voltage ratings of each pellet in the stack. Terminals for the device comprise two leads 94 and 95 bonded to the surfaces 88 and 90, respectivety, of the end pellets of the stack. An enclosure for the device 84 comprises an elongated sleeve 96 of an insulating material, such as alumina ceramic, and two end washers 30. The terminals 94 and 95 extend outwardly of the device enclosure, in sealed relation therewith, through the solder filled central openings of the washers.

What is claimed is:

1. A semiconductor device comprising:
two semiconductor pellets;
a washer of insulating material disposed between said pellets, the opening of said washer communicating with surfaces of said pellets;
a mass of metal filling said opening and bonded to said washer and to said pellet surfaces; and
said pellets and said washer comprising a rigid three element laminate bound together by said mass of metal.

2. A semiconductor device comprising:
a first semiconductor pellet;
an insulating member having a pair of external surfaces and an axial opening through said member extending between said surfaces, said opening being filled with a solid, electrically conductive material, one of the surfaces of said insulating member being engaged with said first pellet, a portion of said first pellet being directly bonded to said conductive material; and
a second semiconductor pellet mounted on the other of said insulating member surfaces and being spaced from said first pellet by said member, said second pellet being directly bonded to said conductive material.

3. A semiconductor device as in claim 2 wherein:
the opening in said insulating member at said one surface is disposed over said portion of said pellet;
said second pellet is disposed over the opening in the other surface of said insulating member; and
said conductive material mechanically joins together said insulating member and said pellets.

4. A semiconductor device as in claim 3 wherein:
first pellet has an electrode thereon in spaced relation with said portion; and
said insulating member is disposed on said pellet between said electrode and said portion.

5. A semiconductor device as in claim 4 wherein the thickness of said insulating member is greater than the thickness of said electrode, said second pellet being thus spaced out of contact with said electrode.

* * * * *